(12) United States Patent
Gaff et al.

(10) Patent No.: US 10,892,197 B2
(45) Date of Patent: *Jan. 12, 2021

(54) EDGE SEAL CONFIGURATIONS FOR A LOWER ELECTRODE ASSEMBLY

(71) Applicant: Lam Research Corporation, Fremont, CA (US)

(72) Inventors: Keith William Gaff, Fremont, CA (US); Matthew Busche, Santa Clara, CA (US); Anthony Ricci, Foster City, CA (US); Henry S. Povolny, Newark, CA (US); Scott Stevenot, Pleasanton, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 16/115,627

(22) Filed: Aug. 29, 2018

(65) Prior Publication Data

US 2018/0366379 A1    Dec. 20, 2018

Related U.S. Application Data

(62) Division of application No. 14/141,079, filed on Dec. 26, 2013, now Pat. No. 10,090,211.

(51) Int. Cl.
*H01J 37/32* (2006.01)
*H01L 21/66* (2006.01)
*H01L 21/67* (2006.01)

(52) U.S. Cl.
CPC ........ *H01L 22/26* (2013.01); *H01J 37/32082* (2013.01); *H01J 37/32513* (2013.01);
(Continued)

(58) Field of Classification Search
None
See application file for complete search history.

(56) References Cited

U.S. PATENT DOCUMENTS

| 2,918,336 A | 12/1959 | Works et al. |
| 3,052,478 A | 9/1962 | Horvereid |

(Continued)

FOREIGN PATENT DOCUMENTS

| CN | 1488161 A | 4/2004 |
| CN | 1822317 A | 8/2006 |

(Continued)

OTHER PUBLICATIONS

International Search Report and Written Opinion dated Jan. 7, 2013 for PCT/US2012/061020, 13 pages.

(Continued)

*Primary Examiner* — Sylvia Macarthur

(57) ABSTRACT

A lower electrode assembly configured to support a semiconductor substrate in a plasma processing chamber includes a base plate, an upper plate above the base plate, and a mounting groove surrounding a bond layer located between the base plate and the upper plate. An edge seal including a compressible ring is mounted in the mounting groove such that the compressible ring is axially compressed between the upper plate and the base plate. At least one gas passage is in fluid communication with an annular space between the compressible ring and an inner wall of the mounting groove. The at least gas one passage extends through the base plate and includes a plurality of outlets in fluid communication with the annular space. In some examples, a backing seal may be located between the edge seal and an inner wall of the mounting groove.

16 Claims, 7 Drawing Sheets

(52) U.S. Cl.
CPC .. *H01J 37/32522* (2013.01); *H01J 37/32532* (2013.01); *H01J 37/3244* (2013.01); *H01L 21/67069* (2013.01)

(56) References Cited

U.S. PATENT DOCUMENTS

| | | | |
|---|---|---|---|
| 3,915,462 A | 10/1975 | Bruns et al. | |
| 4,577,874 A | 3/1986 | Zitting | |
| 4,639,388 A | 1/1987 | Ainsworth et al. | |
| 4,702,482 A | 10/1987 | Oseman | |
| 4,889,351 A | 12/1989 | Frost | |
| 5,002,290 A | 3/1991 | Pernin | |
| 5,040,905 A | 8/1991 | Boyd | |
| 5,074,456 A | 12/1991 | Degner et al. | |
| 5,155,652 A | 10/1992 | Logan et al. | |
| 5,172,921 A | 12/1992 | Stenlund | |
| 5,191,506 A | 3/1993 | Logan et al. | |
| 5,238,499 A | 8/1993 | Van de Ven et al. | |
| 5,280,156 A | 1/1994 | Niori et al. | |
| 5,460,684 A | 10/1995 | Saeki et al. | |
| 5,536,018 A | 7/1996 | Szott | |
| 5,538,262 A | 7/1996 | Matsumura | |
| 5,539,179 A | 7/1996 | Nozawa et al. | |
| 5,551,706 A | 9/1996 | Barna et al. | |
| 5,569,356 A | 10/1996 | Lenz et al. | |
| 5,606,485 A | 2/1997 | Shamouilian et al. | |
| 5,631,803 A | 5/1997 | Cameron et al. | |
| 5,636,098 A | 6/1997 | Salfelder et al. | |
| 5,676,745 A | 10/1997 | Kelly et al. | |
| 5,678,829 A | 10/1997 | Kalsi et al. | |
| 5,692,758 A | 12/1997 | Wikstrom | |
| 5,722,668 A | 3/1998 | Rice et al. | |
| 5,740,009 A | 4/1998 | Pu et al. | |
| 5,745,331 A | 4/1998 | Shamouilian et al. | |
| 5,753,132 A | 5/1998 | Shamouilian et al. | |
| 5,800,618 A | 9/1998 | Niori et al. | |
| 5,851,298 A | 12/1998 | Ishii | |
| 5,868,848 A | 2/1999 | Tsukamoto | |
| 5,870,271 A | 2/1999 | Herchen | |
| 5,885,469 A | 3/1999 | Kholodenko et al. | |
| 5,886,863 A | 3/1999 | Nagasaki et al. | |
| 5,937,541 A | 8/1999 | Weigand et al. | |
| 5,967,402 A | 10/1999 | Kuwabara | |
| 6,069,215 A | 5/2000 | Araki et al. | |
| 6,073,451 A | 6/2000 | Tarumizu | |
| 6,073,577 A | 6/2000 | Lilleland et al. | |
| 6,090,304 A | 7/2000 | Zhu et al. | |
| 6,108,189 A | 8/2000 | Weldon et al. | |
| 6,113,730 A | 9/2000 | Ohya et al. | |
| 6,160,244 A | 12/2000 | Ohashi | |
| 6,166,897 A | 12/2000 | Matsunaga | |
| 6,199,868 B1 | 3/2001 | Evans | |
| 6,244,393 B1 | 6/2001 | Weidenweber et al. | |
| 6,256,187 B1 | 7/2001 | Matsunaga et al. | |
| 6,278,600 B1 | 8/2001 | Shamouilian et al. | |
| 6,280,584 B1 | 8/2001 | Kumar et al. | |
| 6,286,839 B1 | 9/2001 | Mitsui et al. | |
| 6,305,483 B1 | 10/2001 | Portwood | |
| 6,357,759 B1 | 3/2002 | Azuma et al. | |
| 6,364,957 B1 | 4/2002 | Schneider et al. | |
| 6,503,368 B1 | 1/2003 | Kholodenko et al. | |
| 6,508,884 B2 | 1/2003 | Kuibira et al. | |
| 6,540,234 B1 | 4/2003 | Atkinson et al. | |
| 6,554,954 B2 | 4/2003 | Ma et al. | |
| 6,646,233 B2 | 11/2003 | Kanno et al. | |
| 6,689,221 B2 | 2/2004 | Ryding et al. | |
| 6,693,790 B2 | 2/2004 | Matsuki et al. | |
| 6,716,304 B2 | 4/2004 | Kuibira et al. | |
| 6,768,627 B1 | 7/2004 | Kitabayashi et al. | |
| 6,771,482 B2 | 8/2004 | Kenney | |
| 6,802,513 B2 | 10/2004 | Ranzau | |
| 6,822,161 B2 | 11/2004 | Komatsu et al. | |
| 6,831,307 B2 | 12/2004 | Fujii | |
| 6,905,125 B2 | 6/2005 | Shibata et al. | |
| 6,944,006 B2 | 9/2005 | Zheng et al. | |
| 6,962,348 B2 | 11/2005 | Fink | |
| 7,033,444 B1 | 4/2006 | Komino et al. | |
| 7,160,393 B2 | 1/2007 | Takahashi | |
| 7,191,875 B2 | 3/2007 | Kurimoto et al. | |
| 7,195,246 B2 | 3/2007 | Aoshiba et al. | |
| 7,195,469 B2 | 3/2007 | Tsuchiya et al. | |
| 7,274,004 B2 | 9/2007 | Benjamin et al. | |
| 7,431,788 B2 | 10/2008 | Ricci et al. | |
| 7,436,645 B2 | 10/2008 | Holland et al. | |
| 7,436,649 B2 | 10/2008 | Omura | |
| 7,480,129 B2 | 1/2009 | Brown et al. | |
| 7,514,506 B2 | 4/2009 | Mansfield et al. | |
| 7,524,397 B2 | 4/2009 | Hao et al. | |
| 7,582,186 B2 | 9/2009 | Strang et al. | |
| 7,589,950 B2 | 9/2009 | Parkhe et al. | |
| 7,651,571 B2 | 1/2010 | Migita | |
| 7,723,994 B2 | 5/2010 | Kimball et al. | |
| 7,780,786 B2 | 8/2010 | Mitsuhashi et al. | |
| 7,866,669 B2 | 1/2011 | Kobayashi et al. | |
| 7,884,925 B2 | 2/2011 | Howard et al. | |
| 7,896,354 B2 | 3/2011 | Muramatsu | |
| 7,942,425 B2 | 5/2011 | Shojima | |
| 7,993,457 B1 | 8/2011 | Krotov et al. | |
| 7,998,296 B2 | 8/2011 | Ricci et al. | |
| 8,038,796 B2 | 10/2011 | Ricci et al. | |
| 8,104,770 B2 | 1/2012 | Datta et al. | |
| 8,125,757 B2 | 2/2012 | Morooka | |
| 8,242,026 B2 | 8/2012 | Nagaseki | |
| 8,252,132 B2 | 8/2012 | Yoshioka et al. | |
| 8,414,705 B2 | 4/2013 | Nakagawa | |
| 8,454,027 B2 | 6/2013 | Povolny et al. | |
| 8,469,368 B2 | 6/2013 | Kenworthy et al. | |
| 8,503,155 B2 | 8/2013 | Migita | |
| 8,608,856 B2 | 12/2013 | Hayashi et al. | |
| 8,724,288 B2 | 5/2014 | Satou et al. | |
| 8,789,493 B2 | 7/2014 | Ren et al. | |
| 8,845,855 B2 | 9/2014 | Hubacek et al. | |
| 9,412,555 B2 | 8/2016 | Augustino et al. | |
| 9,859,142 B2 | 1/2018 | Schaefer et al. | |
| 9,869,392 B2 | 1/2018 | Schaefer et al. | |
| 2002/0170882 A1 | 11/2002 | Akiba | |
| 2004/0221808 A1 | 11/2004 | Kawano | |
| 2005/0004288 A1 | 1/2005 | Koyanagi et al. | |
| 2005/0042881 A1 | 2/2005 | Nishimoto et al. | |
| 2006/0041069 A1 | 2/2006 | Sumi et al. | |
| 2006/0108217 A1 | 5/2006 | Krempel-Hesse et al. | |
| 2007/0131350 A1 | 6/2007 | Ricci et al. | |
| 2007/0187038 A1 | 8/2007 | Ren et al. | |
| 2008/0088097 A1 | 4/2008 | Tanaka | |
| 2008/0157486 A1 | 7/2008 | Kuzawa et al. | |
| 2008/0173399 A1 | 7/2008 | Nakagawa | |
| 2009/0179366 A1 | 7/2009 | Herchen et al. | |
| 2009/0290145 A1 | 11/2009 | Howard et al. | |
| 2010/0014208 A1 | 1/2010 | Tatsuhiko et al. | |
| 2010/0044974 A1 | 2/2010 | Kenworthy et al. | |
| 2010/0078899 A1 | 4/2010 | Povolny et al. | |
| 2010/0108261 A1 | 5/2010 | Augustino et al. | |
| 2010/0117309 A1 | 5/2010 | Yudovsky | |
| 2010/0156054 A1 | 6/2010 | Sun et al. | |
| 2011/0083806 A1 | 4/2011 | Noguchi et al. | |
| 2011/0149462 A1 | 6/2011 | Kugimoto et al. | |
| 2012/0168640 A1 | 7/2012 | Miller et al. | |
| 2012/0299253 A1 | 11/2012 | Kosakai et al. | |
| 2013/0097840 A1 | 4/2013 | Schaefer et al. | |
| 2013/0153147 A1 | 6/2013 | Senzaki et al. | |
| 2013/0239889 A1 | 9/2013 | Lien et al. | |
| 2013/0286530 A1 | 10/2013 | Lin et al. | |
| 2014/0083461 A1 | 3/2014 | Shih et al. | |
| 2015/0187614 A1 | 7/2015 | Gaff et al. | |
| 2018/0106371 A1 | 4/2018 | Schaefer et al. | |
| 2018/0366379 A1* | 12/2018 | Gaff | H01J 37/32532 |

FOREIGN PATENT DOCUMENTS

| | | |
|---|---|---|
| CN | 101385127 A | 3/2009 |
| CN | 102187741 A | 9/2011 |
| EP | 1065701 A2 | 1/2001 |
| JP | H07335731 A | 12/1995 |
| JP | H08289579 A | 11/1996 |

(56) References Cited

FOREIGN PATENT DOCUMENTS

| | | |
|---|---|---|
| JP | H09107689 A | 4/1997 |
| JP | 11-087320 | 3/1999 |
| JP | 2002-313901 A | 10/2002 |
| JP | 2005-033181 A | 2/2005 |
| JP | 2005-164027 A | 6/2005 |
| JP | 2007-142456 A | 6/2007 |
| JP | 2007-194616 A | 8/2007 |
| JP | 2009-144735 A | 7/2009 |
| JP | 2010-129845 A | 6/2010 |
| JP | 2011-525040 A | 9/2011 |
| TW | 200710935 A | 3/2007 |
| TW | 201005857 A | 2/2010 |
| WO | WO-9944221 A1 | 9/1999 |
| WO | WO-03023829 A2 | 3/2003 |
| WO | WO-2009143350 A2 | 11/2009 |

OTHER PUBLICATIONS

International Preliminary Report on Patentability dated Apr. 22, 2014 for PCT/US2012/061020; 10 pages.
Kalrez Parts From DuPont Performance Elastomers, "Physical Properties and Compound Comparisons", Technical Information, Rev. 5, Feb. 2003, 4 pages.
Translation Translation of Notification of the Office Action corresponding to Korean Patent Application No. 10-2014-7013567, dated Mar. 14, 2019, 2 pages.

* cited by examiner

EDGE SEAL CONFIGURATIONS FOR A LOWER ELECTRODE ASSEMBLY

CROSS-REFERENCE TO RELATED APPLICATIONS

The present disclosure is a continuation of U.S. patent application Ser. No. 14/141,079 filed on Dec. 26, 2013. This application is related to U.S. patent application Ser. No. 13/277,873, entitled Edge Seal for Lower Electrode Assembly, filed on Oct. 20, 2011, and U.S. patent application Ser. No. 13/528,194, entitled Edge Seal for Lower Electrode Assembly, filed on Jun. 20, 2012. The entire disclosures of the applications referenced above are incorporated herein by reference.

FIELD

The present disclosure relates to improvements in edge seals for lower electrode assemblies used in plasma processing chambers such as plasma etch reactors.

BACKGROUND

Integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability and speed of these circuits have led them to become a ubiquitous feature of modern digital electronics.

The fabrication of integrated semiconductor circuits typically takes place in a reactive ion etching system, such as a parallel plate reactor or inductively coupled plasma reactor. A reactive ion etching system may consist of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as CF4, CHF3, CClF3, HBr, Cl2 and SF6 or mixtures thereof with O2, N2, He or Ar is introduced into the etching chamber and maintained at a pressure which is typically in the millitorr range. The upper electrode is provided with gas hole(s) which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched side walls.

SUMMARY

A lower electrode assembly useful for supporting a semiconductor substrate in a plasma processing chamber comprises an upper plate, a temperature controlled lower base plate, a mounting groove surrounding a bond layer in the lower electrode assembly, and an edge seal comprising a ring compressed in the groove, and a gas passage in fluid communication with the groove. The gas passage can be used to supply inert gas to the groove and maintain the inert gas at a pressure of 100 mTorr to 100 Torr in an annular space between walls of the groove and the ring.

DETAILED DESCRIPTION

A lower electrode assembly typically includes an electrostatic clamping layer on which a wafer is clamped during processing in a plasma processing chamber. The lower electrode assembly can also include various layers bonded to a temperature controlled base plate. For example, the assembly can include an upper ceramic layer incorporating one or more electrostatic electrodes adhesively bonded to an upper side of a heater plate, one or more heaters adhesively bonded to a bottom of the heater plate, and a base plate adhesively bonded to the heaters and heater plate. To protect the exposed adhesive bond layers, the heater plate has a smaller diameter than the ceramic layer and base plate and an edge seal of elastomeric material is located in a mounting groove between the ceramic layer and the base plate. To provide an effective seal, the edge seal is axially compressed 1 to 20%, preferably about 5% to completely fill the mounting groove. The edge seal can be in the form of an O-ring or ring with a non-circular cross-section such as a rectangular cross section with a concave outer surface which during compression bulges outwardly without contacting a surrounding edge ring.

A problem with such rings is trapped air in the groove after installation which escapes when exposed to vacuum conditions such as when the chamber is pumped down during processing of semiconductor substrates supported on the electrode assembly. Another problem is caused by leakage of reactive chemical species past the sealing surface which can degrade the bond layer and cause vacuum leaks, helium coolant leaks or unacceptable changes in temperature uniformity and consequent failure of the ESC to operate correctly. To avoid the problems noted above, a gas passage is provided in the lower electrode assembly to deliver inert gas to an annular space between the walls of the groove and the ring. By maintaining the inert gas at a positive pressure with respect to the vacuum in the chamber, the inert gas can prevent leakage of chemical species from the chamber past the ring and into the annular space and thereby protect the bond layer from attack by the chemical species. The inert gas can flow through the gas passage and enter the annular space through multiple gas outlets arranged along the groove. A preferred inert gas is Argon (Ar) or Helium (He) but other gases such as Nitrogen (N2) may be used. The gas pressure is preferably high enough to prevent ingress of chemical species past the ring but low enough such that the inert gas flowing into the chamber does not affect the process carried out in the chamber. A preferred gas pressure in the annular space is 1 to 20 Torr and a preferred flow rate of the inert gas into the chamber is less than 20 seem.

Figure 1:
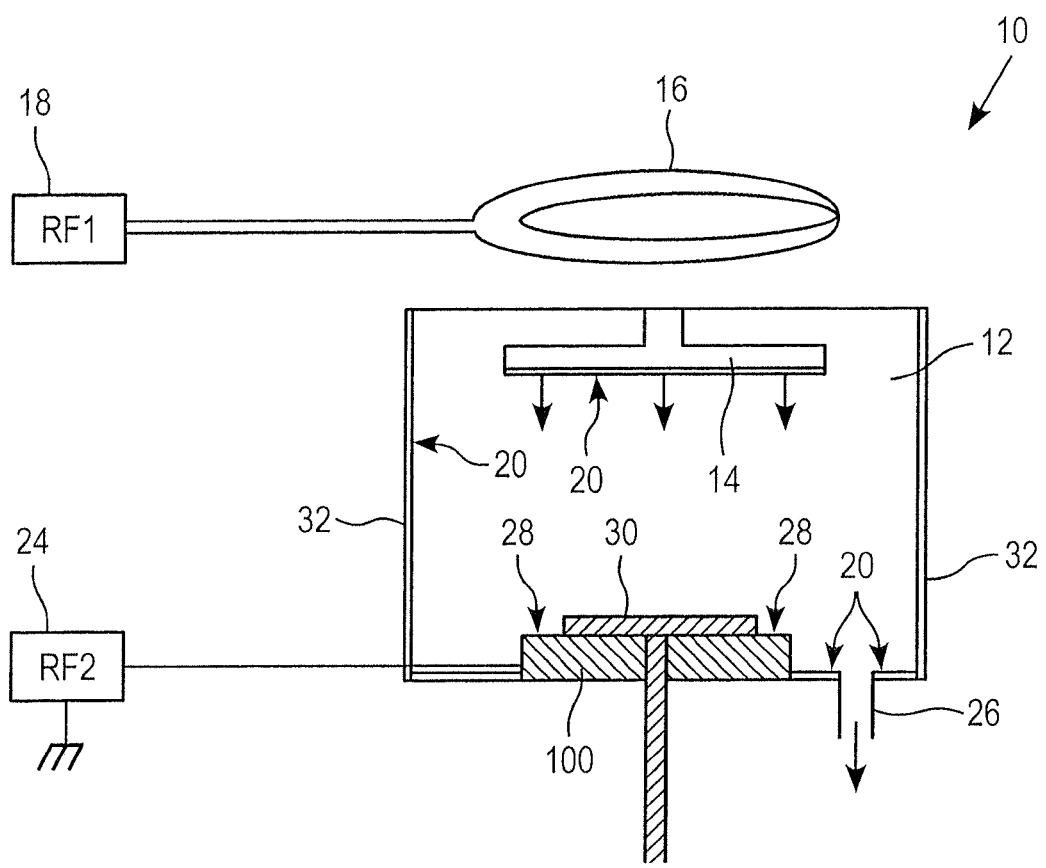
FIG. 1 shows a cross-sectional view of a processing chamber suitable for plasma etching semiconductor substrates.

FIG. 1 shows a cross-sectional view of an exemplary plasma reactor 10 for etching substrates. As shown in FIG. 1, the plasma reactor 10 includes a plasma processing chamber 12, an antenna disposed above the chamber 12 to generate plasma, which is implemented by a planar coil 16. The RF coil 16 is typically energized by an RF generator 18 via a matching network (not shown). Such chambers are called inductively coupled plasma (ICP) chambers. To supply process gas to the interior of the chamber 12, there is provided a gas distribution plate or showerhead 14, which preferably includes a plurality of holes for releasing gaseous source materials, e.g., the etchant source gases, into the RF-induced plasma region between the showerhead 14 and a semiconductor substrate or wafer 30 supported on a lower electrode assembly 28. While an inductively coupled plasma reactor is shown in FIG. 1, the plasma reactor 10 can incorporate other plasma generating sources such as capacitive coupled plasma (CCP), microwave, magnetron, helicon, or other suitable plasma generating equipment, in which case the antenna is omitted.

The gaseous source materials may also be introduced into the chamber 12 by other arrangements such as one or more gas injectors extending through the top wall and/or gas ejection ports built into the walls of chamber 12. Etchant source chemicals include, for example, halogens such as Cl2 and BCl3 when etching through aluminum or one of its alloys. Other etchant chemicals (e.g., CH4, HBr, HCl, CHCl3) as well as polymer forming species such as hydrocarbons, fluorocarbons, and hydro-fluorocarbons for sidewall passivation of etched features may also be used. These gases may be employed along with optional inert and/or nonreactive gases.

In use, a wafer 30 is introduced into chamber 12 defined by chamber walls 32 and disposed on the lower electrode assembly 28. The wafer 30 is preferably biased by a radio frequency generator 24 (also typically via a matching network). The wafer 30 can comprise a plurality of integrated circuits (ICs) fabricated thereon. The ICs, for example, can include logic devices such as PLAs, FPGAs and ASICs or memory devices such as random access memories (RAMs), dynamic RAMs (DRAMs), synchronous DRAMs (SDRAMs), or read only memories (ROMs). When the RF power is applied, reactive species (formed from the source gas) etch exposed surfaces of the wafer 30. The by-products, which may be volatile, are then exhausted through an exit port 26. After processing is complete, the wafer 30 can be subjected to further processing and eventually diced to separate the ICs into individual chips.

The plasma exposed surfaces of any plasma confinement apparatus (not shown), chamber wall 32, chamber liner (not shown) and/or showerhead 14 can be provided with a plasma sprayed coating 20 with surface roughness characteristics that promote polymer adhesion. In addition, plasma exposed surfaces of the substrate support 28 can also be provided with a plasma sprayed coating (not shown). In this manner, substantially all surfaces that confine the plasma will have surface roughness characteristics that promote polymer adhesion. In this manner, particulate contamination inside the reactor can be substantially reduced.

It can be appreciated that the reactor 10 can also be used for metal, dielectric and other etch processes. In plasma etch processing, the gas distribution plate can be a circular plate situated directly below a dielectric window in an ICP reactor or form part of an upper electrode assembly in a CCP reactor called a parallel plate reactor wherein the gas distribution plate is a showerhead electrode oriented parallel to a semiconductor substrate or wafer 30. The gas distribution plate/ showerhead electrode contains an array of holes of a specified diameter and spatial distribution to optimize etch uniformity of the layers to be etched, e.g., a photoresist layer, a silicon dioxide layer and an underlayer material on the wafer.

An exemplary parallel-plate plasma reactor that can be used is a dual-frequency plasma etch reactor (see, e.g., commonly-owned U.S. Pat. No. 6,090,304, which is hereby incorporated by reference in its entirety). In such reactors, etching gas can be supplied to a showerhead electrode from a gas supply and plasma can be generated in the reactor by supplying RF energy at different frequencies from two RF sources to the showerhead electrode and/or a bottom electrode. Alternatively, the showerhead electrode can be electrically grounded and RF energy at two different frequencies can be supplied to the bottom electrode.

Figure 2:
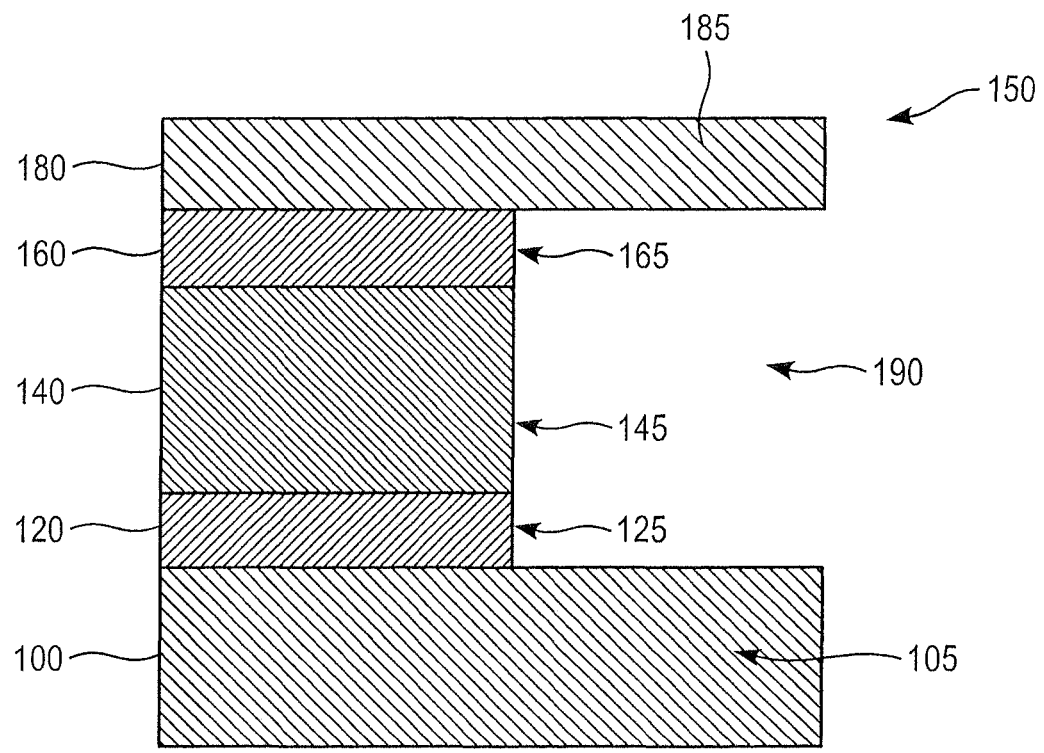
FIG. 2 shows a cross-sectional view of an upper ceramic layer and lower base plate of an electrode assembly having a mounting groove therebetween.

FIG. 2 shows a cross-sectional view of a lower electrode assembly 150 having various layers bonded together with exposed bond layers located in a mounting groove adapted to receive an edge seal comprising an elastomeric band. The electrode assembly 150 comprises an upper ceramic member 180 incorporating an electrostatic clamping electrode and attached to a lower member 100 such as a temperature controlled base plate. Disposed between the upper member 180 and the lower member 100 is a heater plate 140 comprising a metal or ceramic plate and one or more heaters such as a film heater coupled to the bottom of the plate. Adhesive bonding layer 120 is disposed between the lower member 100 and the heater plate 140 and bonds lower member 100 to heater plate 140. Adhesive bonding layer 160 is disposed between the upper member 180 and the heater plate 140 and bonds upper member 180 to heater plate 140. The upper member 180 and lower member 100 extend beyond the heater plate 140 and bonding layers 120, 160 to form an annular groove 190. The outer peripheries 145, 125, 165 of the heater plate 140 and bond layers 120, 160 are substantially aligned with respect to one another. The outer peripheries 185, 105 of the upper member 180 and lower member 100 may or may not be vertically aligned and additional layers may be included between the upper and lower members.

The upper member 180 preferably is an electrostatic clamping layer of ceramic material and embedded electrode comprised of a metallic material, such as W, Mo etc. In addition, the upper member 180 preferably has a uniform thickness from the center to the outer edge or diameter thereof. The upper member 180 is preferably a thin circular plate suitable for supporting 200 mm, 300 mm or 450 mm diameter wafers. Details of a lower electrode assembly having an upper electrostatic clamping layer, heater layer and bonding layers are disclosed in commonly owned U.S. Published Patent Application 2006/0144516 wherein the upper electrostatic clamping layer has a thickness of about 0.04 inch, the upper bonding layer has a thickness of about 0.004 inch, the heater plate comprises a metal or ceramic plate of about 0.04 inch thickness and a heater film of about 0.01 inch thickness, and the lower bonding layer has a thickness of about 0.013 to 0.04 inch. The rectangular mounting groove between the upper clamping layer and the base plate has a height of at least about 0.03 to 0.15 inch and a depth of about 0.03 to 0.15 inch. In a preferred embodiment for processing 300 mm wafers, the groove can have a height of at least about 0.07 inch and a depth of about 0.035 inch. When inserted in the groove, the edge seal is preferably expanded radially and compressed vertically to tightly fit in the groove. However, if the edge seal has a rectangular cross section it will bulge outwardly and may contact a surrounding edge ring and/or tensile stresses on the outer surface of the edge seal can lead to cracking when exposed to fluorine or oxygen plasmas.

The lower base plate 100 is preferably a circular plate having an upper surface and lower surface. In one embodiment, the lower member 100 can be configured to provide temperature control by the inclusion of fluid channels (not shown) therein through which a temperature controlled liquid can be circulated to the electrode assembly 150. In an electrode assembly 150, the lower member 100 is typically a metal base plate which functions as the lower RF electrode in the plasma chamber. The lower member 100 preferably comprises an anodized aluminum or aluminum alloy. However, it can be appreciated that any suitable material, including metallic, ceramic, electrically conductive and dielectric materials can be used. In one embodiment, the lower member 100 is formed from an anodized machined aluminum block. Alternatively, the lower member 100 could be of ceramic material with one or more electrodes located therein and/or on an upper surface thereof.

As shown in FIG. 2, bond layer 120 bonds the lower member 100 to the heater plate 140. Bond layer 160 bonds the upper member 180 to the heater plate 140. The bond layers 120, 160 are preferably formed from a low modulus material such as an elastomeric silicone or silicone rubber material. However, any suitable bonding material can be used. It can be appreciated that the thickness of the bond layers 120, 160 can vary depending on the desired heat transfer coefficient. Thus, the thickness thereof is adapted to provide a desired heat transfer coefficient based on manufacturing tolerances of the bond layers. Typically, the bond layers 120, 160 will vary over its applied area by plus or minus a specified variable. Typically, if the bond layer thickness does not vary by more than 1.5 percent, the heat transfer coefficient between the upper and lower members 180, 100 can be made substantially uniform.

For example, for an electrode assembly 150 used in the semiconductor industry, the bond layers 120, 160 preferably have a chemical structure that can withstand a wide range of temperatures. Thus, it can be appreciated that the low modulus material can comprise any suitable material, such as a polymeric material compatible with a vacuum environment and resistant to thermal degradation at high temperatures (e.g., up to 500° C.). In one embodiment, bond layers 120, 160 may comprise silicone and be between about 0.001 to about 0.12 inch thick and more preferably about 0.003 to about 0.030 of an inch thick.

The heater plate 140 can comprise a laminate bonded to a lower surface of the upper member 180. For example, heater plate 140 can be in the form of a metal or ceramic plate with a film heater coupled to a bottom of the metal or ceramic plate. The heater film can be a foil laminate (not shown) comprising a first insulation layer (e.g., dielectric layer), a heating layer (e.g., one or more strips of electrically resistive material) and a second insulation layer (e.g., dielectric layer). The insulation layers preferably consist of materials having the ability to maintain its physical, electrical and mechanical properties over a wide temperature range including resistance to corrosive gases in a plasma environment such as KAPTON or other suitable polyimide films. The heater element(s) preferably consists of a high strength alloy such as Inconel or other suitable alloy or anti-corrosion and resistive heating materials. Typically, the film heater is in the form of a laminate of KAPTON, INCONEL and KAPTON having a total thickness of about 0.005 to about 0.009 of an inch and more preferably about 0.007 of an inch thick.

As shown in FIG. 2, outer peripheries 105, 185 of the lower member 100 and upper member 180 can extend beyond the outer peripheries 145, 125, 165 of the heater plate 140 and bond layers 120, 160, thereby forming a mounting groove 190 in the electrode assembly 150. The material(s) of bond layers 120, 160 are typically not resistant to the reactive etching chemistry of semi-conductor plasma processing reactors and must, therefore, be protected to accomplish a useful operation lifetime. To protect the bond layers 120, 160, it has been proposed to place an edge seal in the form of an elastomeric band into groove 190 to form a tight seal that prevents penetration of the corrosive gases of semi-conductor plasma processing reactors. See, for example, commonly owned U.S. Published Applications 2009/0290145, 2010/0078899 and 2013/0097840.

Figure 3:
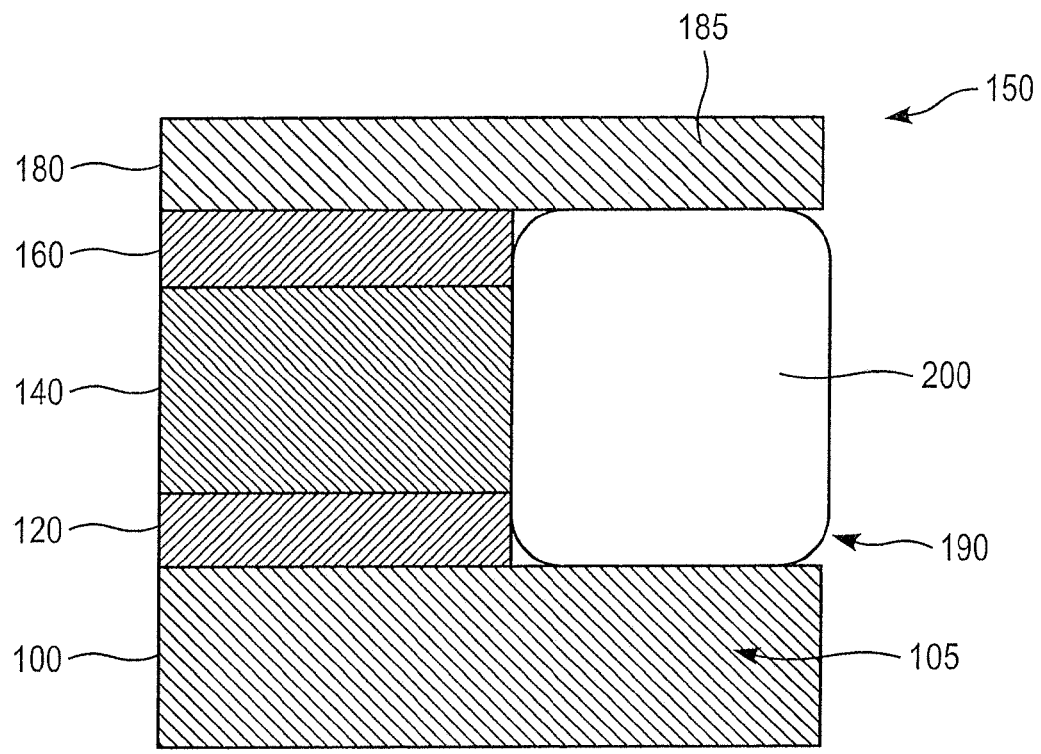
FIG. 3 shows a cross-sectional view of a rectangular elastomeric band disposed in the mounting groove between an upper ceramic layer and lower base plate of an electrode assembly.

FIG. 3 shows a cross-sectional profile of an electrode assembly 150 that includes an annular elastomeric band 200. When the band 200 is disposed in groove 190, the band 200 is axially compressed at least 5% and preferably at least 10 to 20% or higher. The band can be an O-ring or ring having a non-circular cross-section such as a rectangular band having a vertical inner surface, horizontal upper and lower surfaces and a concave outer surface. The band can be made of a single material such as silicone rubber or preferably erosion resistant elastomer material such as PERLAST (FFKM elastomer) or composite materials such as a core of silicone and a coating of a fluoropolymer such as TEFLON. For example, a TEFLON encapsulated O-ring can include a TEFLON (PFA or PTFE) encapsulation layer 0.010" thick with a silicone core. This O-ring construction combines the compression set resistance of a standard elastomer O-ring with the excellent chemical resistance of TEFLON, making it an ideal choice for this sealing application. TEFLON encapsulated O-rings are available from companies such as M-Cor Inc., Row Inc. and Creavy Seal Co. A disadvantage of a TEFLON encapsulated O-ring is its' poor sealing performance as compared to a typical elastomer O-ring. A TEFLON encapsulated O-ring is usually installed with high compression (20%+) to ensure a sufficient seal. However, when used as the elastomer band 200, the TEFLON O-ring can create a sufficient seal, even at lower compressions than 20%.

Figure 4:
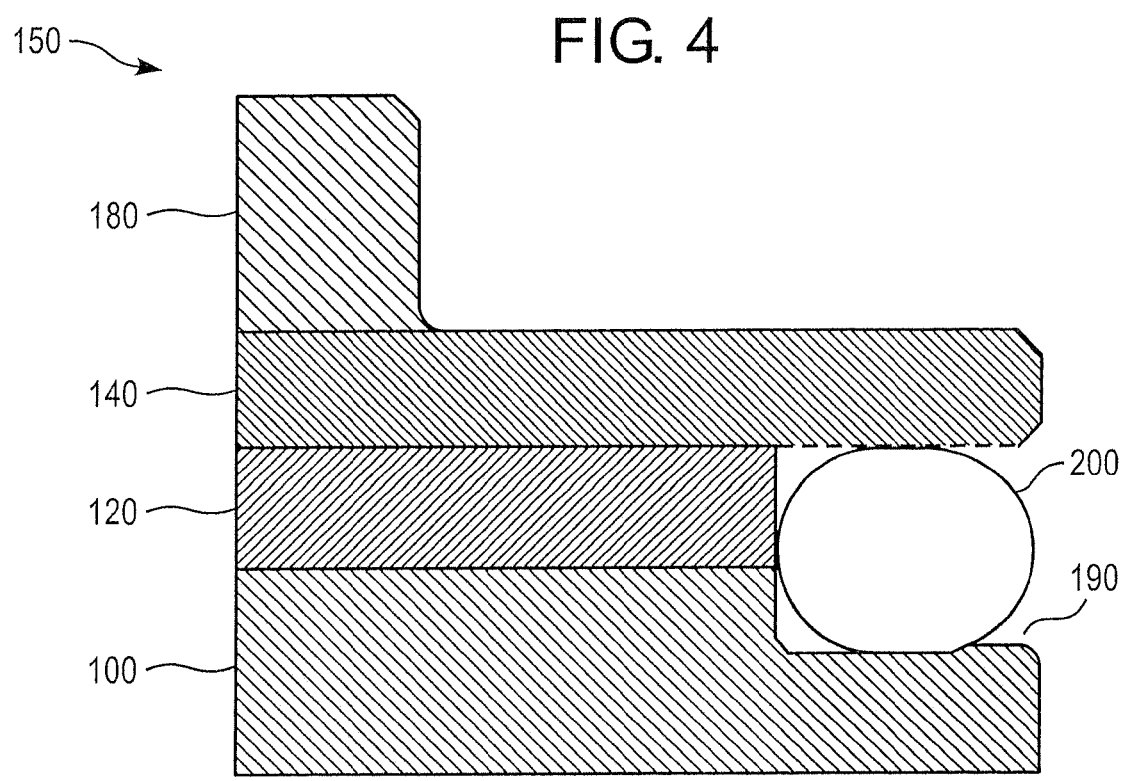
FIG. 4 shows a cross-sectional view of a lower electrode assembly having a TEFLON-encapsulated O-ring in the mounting groove having polished surfaces and a dovetail feature.
Figure 5:
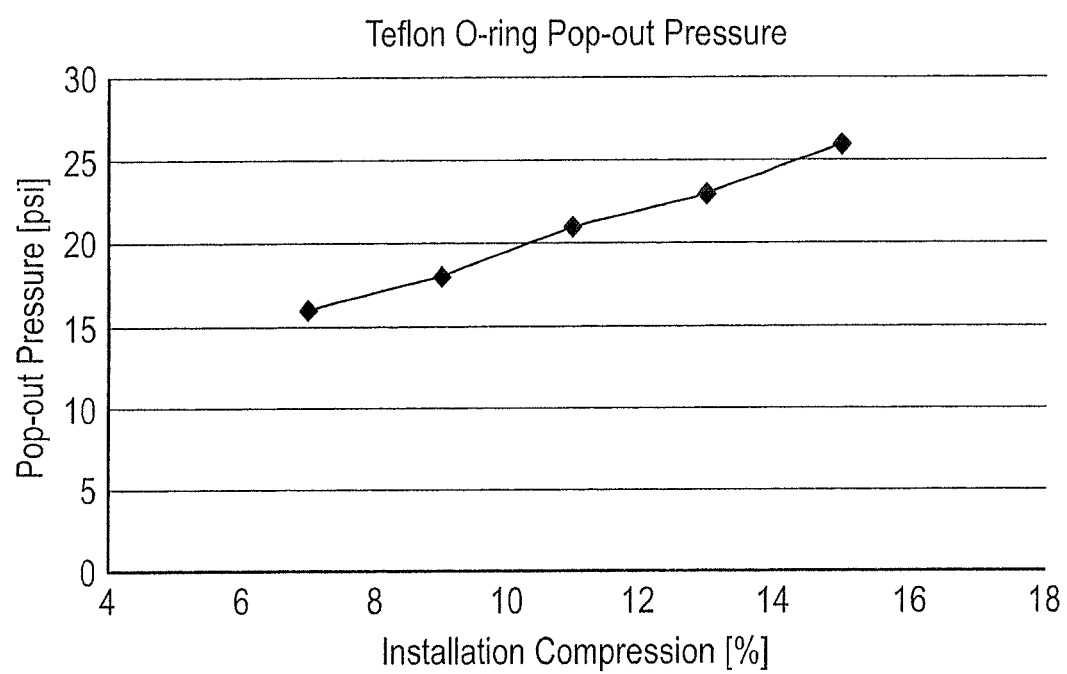
FIG. 5 is a graph of pop-out pressure (psi) versus installation compression (%) for the TEFLON-encapsulated O-ring.

FIG. 4 shows a cross-sectional view of an electrode assembly 150 and modified edge seal comprising elastomeric band 200. The electrode assembly 150 of FIG. 4 is the same as the electrode assembly of FIG. 2 and FIG. 3 but the band 200 is held in a groove having polished surfaces and a dovetail feature formed by a step along the upper and/or lower wall of the groove. One way to improve the seal is to polish surfaces of the groove 190. For example, a ceramic polished to a suitable surface roughness such as up to 32 microinch Ra. Preferably, the groove is polished to a 4 microinch Ra (mirror-like) surface roughness which can achieve a seal 30 times better than a ceramic with a standard, as ground 12 microinch Ra surface roughness. Also, to prevent pop-out of the band, the groove 190 can be provided with a dovetail feature. O-ring pop-out can be a major challenge to overcome in the design of the elastomer band 200. When the process chamber is pumped down to vacuum, air entrapped behind the O-ring will push the O-ring out of place unless it is retained by some means. Installing the O-ring with stretch is insufficient. With a TEFLON coated O-ring, the TEFLON encapsulation layer is very susceptible to creep deformation. At elevated operating temperature (the ESC can operate to 175° C.) the TEFLON material will creep, leading to a relaxation that eliminates the O-ring stretch load. For this reason a dovetail feature is required. Through testing, it has been determined that a dovetail feature with a 0.002 inch or higher step provides a good balance of pop-out resistance and ease of installing the O-ring. FIG. 5 shows a range of O-ring compression, the air pressure required to pop an O-ring out of a groove having a 0.004 inch step. Since all values are above atmospheric pressure (14.7 psi), the risk of O-ring pop-out is low. But this data also shows that a minimum of 8% O-ring compression at installation is required to avoid pop-out.

The elastomeric band 200 can be constructed from any suitable semiconductor processing compatible material. For example, curable fluoroelastomeric fluoropolymers (FKM) capable of being cured to form a fluoroelastomer or curable perfluoroelastomeric perfluoropolymers (FFKM) can be used. The elastomeric band 200 is preferably constructed of a polymer such as a fluorocarbon polymer material such as TEFLON (PTFE—PolyTetraFluoroEthylene, manufactured by DuPont). However, plastics, polymeric materials, Perfluoroalkoxy (PFA), fluorinated polymers, and polyimides can be used. The elastomeric band 200 is preferably comprised of a material having high chemical resistance, low and high temperature capability, resistance to plasma erosion in a plasma reactor, low friction, and electrical and thermal insulation properties. A preferred material is a material having a Shore A hardness of 60 to 75 and a specific gravity of 1.9 to 2.1 such as PERLAST available from Perlast Ltd. Another band material is KALREZ available form DuPont Performance Elastomers. PERLAST and KALREZ are FFKM elastomers.

Preferably, the elastomeric band 200 is comprised of a material having high chemical resistance, low and high temperature capability, resistance to plasma erosion in a plasma reactor, low friction, a Shore A hardness less than 85, more preferably a Shore A hardness less than 75, and electrical and thermal insulating properties. Most preferably the elastomeric band is an unfilled elastomer and has a metallic content less than 5000 parts per billion for each and every metal element as metals in the elastomer can result in particle generation and metal contamination on semiconductor substrates during operation.

Figure 6:
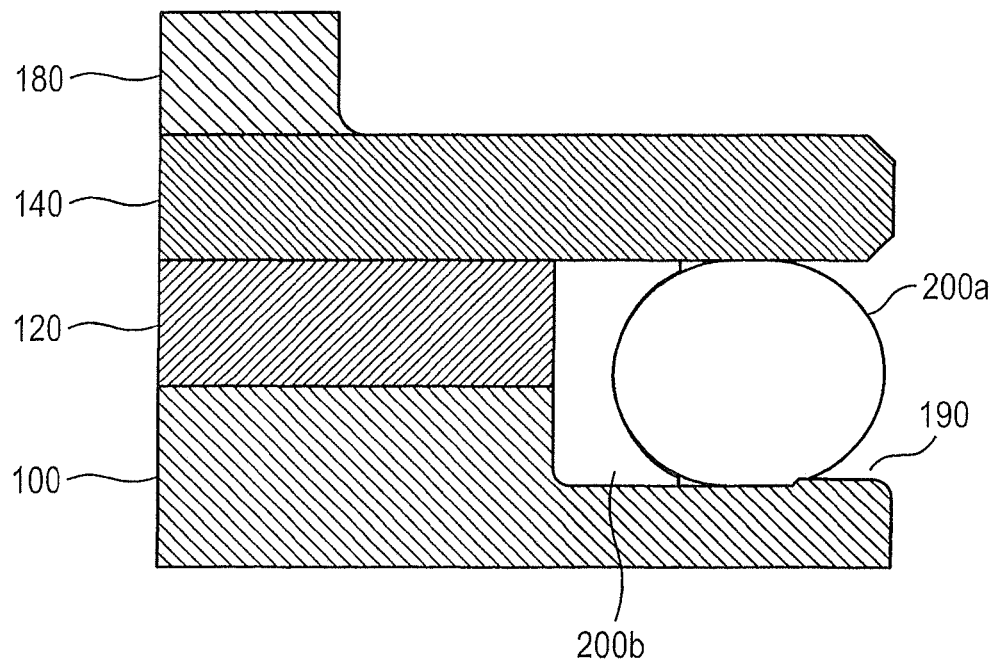
FIG. 6 shows a cross-sectional view of a lower electrode assembly with a backing seal between the walls of the mounting groove and the TEFLON-coated O-ring.

In an alternate embodiment, the seal includes an O-ring 200a and a backing seal 200b. FIG. 6 illustrates a "backing seal" that could be employed in this application. This backing seal would be made of PERLAST material or some other suitable high-performance elastomer. The backing seal would 1) help prevent pop-out by filling much of the volume behind the encapsulated TEFLON O-ring. This reduces the volume of entrapped air, and thus reduces the risk of pop-out by lowering the entrapped volume, the risk of pop-out is reduced. The backing seal would also 2) drastically reduce the leak rate across the seal, thus providing improved protection to the ESC bond. Softer elastomer seals (such as PERLAST) have much better sealing performance than TEFLON and the backing seal will be pushed against the sealing surfaces by the TEFLON encapsulated O-ring, creating more seal pressure than an elastomer seal used alone. Additionally, suitable sealing performance could be achieved without polished contact surfaces in the groove. The advantage of the combined hybrid seal using a TEFLON-encapsulated O-ring and backing seal is that seal is still "permanent". The exposed surface is still TEFLON and expected to erode very slowly. The PERLAST backing seal, though made of the less erosion susceptible PERLAST material, is sufficiently protected.

Figure 7:
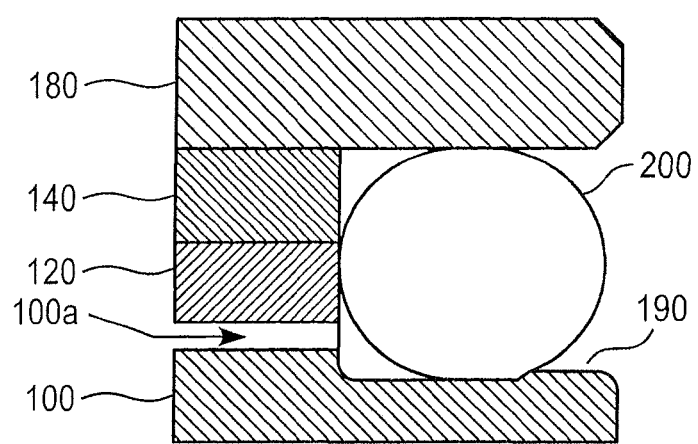
FIG. 7 shows a cross-sectional view of a lower electrode assembly having a gas passage delivering inert gas to the mounting groove.
Figure 8:
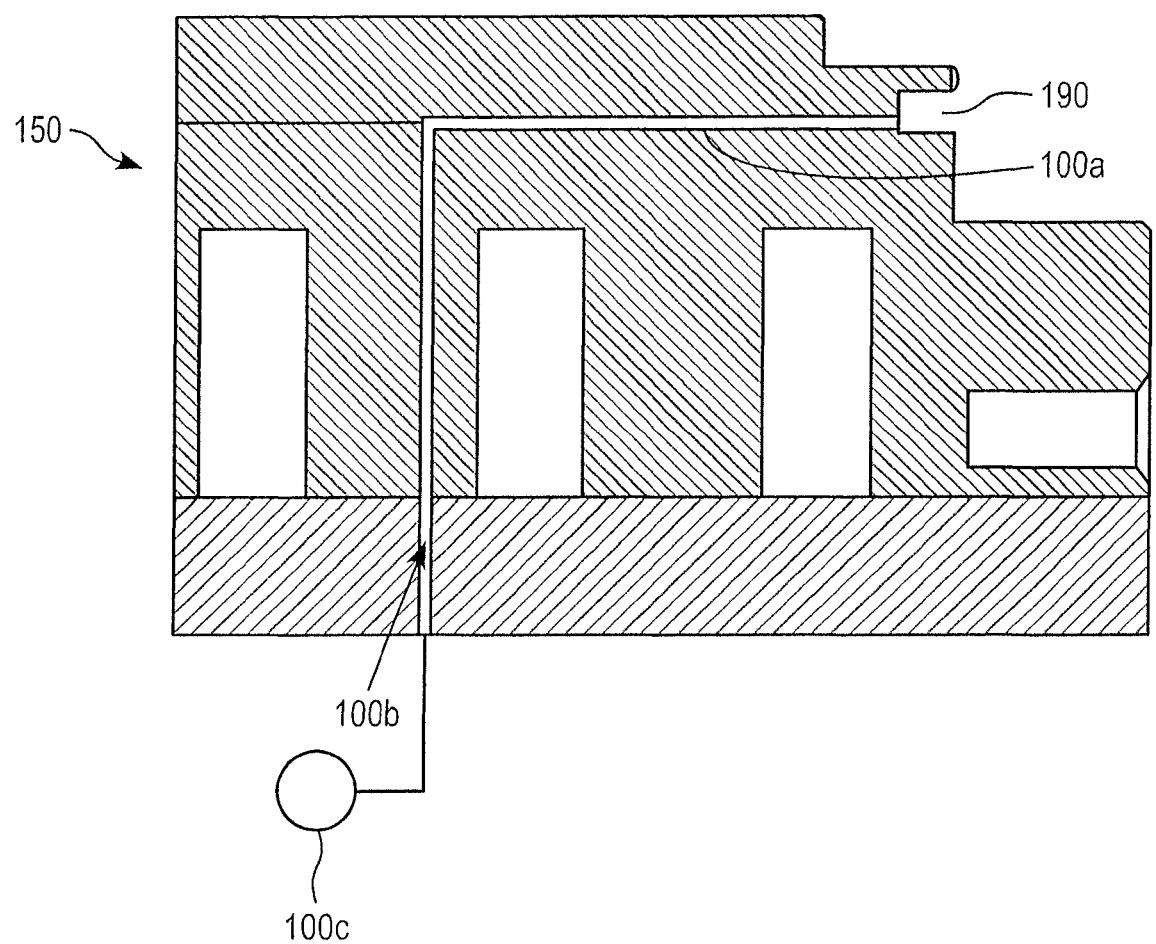
FIG. 8 shows a cross-sectional view of a lower electrode assembly wherein a gas source supplies gas to the gas passage illustrated in FIG. 7.

In an exemplary embodiment, the height of the O-ring after compression can be about 0.118 inch±0.005 inch. The groove preferably includes a 0.004 inch step extending upward from the lower wall of the groove against which an outer surface of the O-ring fits when compressed in the groove. The gas passage delivering inert gas to the annular space between the O-ring and the vertical wall of the groove can extend through the base plate of through the bond layer. For example, one or more gas passages can extend vertically in the base plate and radially extending gas passages can extend from the vertical gas passages to deliver the inert gas through multiple gas outlets along the groove. As shown in FIG. 7, the lower electrode assembly can include a gas passage 100a in the base plate 100 which delivers inert gas to the annular space 190a between the walls of the groove and the O-ring 200. FIG. 8 shows a lower electrode assembly 150 having a vertical gas passage 100b and a horizontal gas passage 100a delivering inert gas to groove 190 from a gas source 100c.

The edge seal can be mounted in other lower electrode assemblies which do not include heater plates. For example, the elastomeric band can be mounted in a mounting groove surrounding a bond layer in a lower electrode assembly having an upper plate, and a temperature controlled lower base plate wherein the band is mounted in the groove such that the band is compressed and an inert gas is supplied under pressure to the volume between the band and the inner walls of the groove.

In use, the lower electrode assembly can be mounted in an interior of a plasma etch chamber and the upper layer of the electrode assembly can include an electrostatic chuck (ESC).

A semiconductor substrate mounted on the lower electrode assembly can be plasma etched by introducing process gas into a chamber containing the lower electrode assembly, energizing the process gas into a plasma state and plasma etching the semiconductor substrate with the plasma while supplying inert gas to the annular space and maintaining the inert gas at a pressure of 1 to 20 Torr in the annular space.

The plasma etching process can include monitoring a flow rate of the inert gas to the annular space and issuing an alarm if the flow rate exceeds a threshold value indicating inadequate sealing by the ring.

The term "about" as used herein with respect to dimensions means plus or minus 10% of the dimension.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. A lower electrode assembly configured to support a semiconductor substrate in a plasma processing chamber, the lower electrode assembly comprising:

a base plate, an upper plate above the base plate, and a mounting groove surrounding a bond layer located between the base plate and the upper plate;

an edge seal comprising a compressible ring mounted in the mounting groove such that the compressible ring is axially compressed between the upper plate and the base plate; and at least one gas passage in fluid communication with an annular space between the compressible ring and an inner wall of the mounting groove, wherein the at least one gas passage extends from a gas source through the base plate to the annular space to pressurize the annular space and includes a plurality of outlets in fluid communication with the annular space.

2. The lower electrode assembly of claim 1, further comprising:

the gas source, wherein the gas source is configured to supply inert gas to the gas passage, wherein the gas source is configured to maintain the inert gas at a pressure of 100 mTorr to 100 Torr in the annular space.

3. The lower electrode assembly of claim 2, further comprising:

a pressure monitor configured to monitor pressure in the annular space, wherein the pressure monitor is configured to generate an alarm if gas flow to the annular space exceeds a threshold flow rate indicating inadequate sealing by the compressible ring.

4. The lower electrode assembly of claim 1, wherein the inner wall defines an inner radius of the mounting groove, wherein an opening of the mounting groove faces radially outward relative to the inner wall, and wherein the mounting groove includes at least one step extending downward from the upper plate on an upper wall of the mounting groove or extending upward from the base plate on a lower wall of the mounting groove.

5. The lower electrode assembly of claim 4, wherein the compressible ring is axially compressed between the upper plate and the base plate to cause an outer surface of the compressible ring to be biased radially outward relative to the inner wall toward the at least one step, wherein the at least one step is located radially outward of the compressible ring relative to the inner wall such that an outer surface of the compressible ring engages the at least one step to retain the compressible ring within the mounting groove when (a) compressed between the upper plate and the base plate and (b) the plasma processing chamber is pumped down.

6. The lower electrode assembly of claim 1, wherein the compressible ring is one of an O-ring and an elastomer band having a non-circular cross-section.

7. The lower electrode assembly of claim 1, wherein the compressible ring comprises a silicone core and a fluoropolymer coating.

8. The lower electrode assembly of claim 1, wherein each metal element of the compressible ring has a metallic content less than 5000 parts per billion.

9. The lower electrode assembly of claim 1, wherein surfaces of the groove are polished to a surface roughness Ra of 32 microinch or less.

10. A lower electrode assembly configured to support a semiconductor substrate in a plasma processing chamber, the lower electrode assembly comprising:

a base plate, an upper plate above the base plate, and a mounting groove surrounding a bond layer located between the base plate and the upper plate;

an edge seal comprising a compressible ring mounted in the mounting groove such that the compressible ring is axially compressed; and a backing seal located between the edge seal and an inner wall of the mounting groove, wherein the backing seal includes a vertical inner surface, horizontal upper and lower surfaces, and a concave outer surface configured to interface with the edge seal.

11. The lower electrode assembly of claim 10, wherein the inner wall defines an inner radius of the mounting groove, wherein an opening of the mounting groove faces radially outward relative to the inner wall, and wherein the mounting groove includes at least one step extending downward from the upper plate on an upper wall of the mounting groove or extending upward from the base plate on a lower wall of the mounting groove.

12. The lower electrode assembly of claim 11, wherein the compressible ring is axially compressed between the upper plate and the base plate to cause an outer surface of the compressible ring to be biased radially outward relative to the inner wall toward the at least one step, wherein the at least one step is located radially outward of the compressible ring relative to the inner wall such that an outer surface of the compressible ring engages the at least one step to retain the compressible ring within the mounting groove when (a) compressed between the upper plate and the base plate and (b) the plasma processing chamber is pumped down.

13. The lower electrode assembly of claim 10, wherein the compressible ring is one of an O-ring and an elastomer band having a non-circular cross-section.

14. The lower electrode assembly of claim 10, wherein the compressible ring comprises a silicone core and a fluoropolymer coating.

15. The lower electrode assembly of claim 10, wherein each metal element of the compressible ring has a metallic content less than 5000 parts per billion.

16. The electrode assembly of claim 10, wherein surfaces of the groove are polished to a surface roughness Ra of 32 microinch or less.

* * * * *